(12) United States Patent
Choi et al.

(10) Patent No.: US 11,270,969 B2
(45) Date of Patent: Mar. 8, 2022

(54) SEMICONDUCTOR PACKAGE

(71) Applicant: JMJ Korea Co., Ltd., Bucheon-si (KR)

(72) Inventors: Yun Hwa Choi, Bucheon-si (KR);
Jeonghun Cho, Goyang-si (KR);
Young Hun Kim, Incheon (KR);
Taeheon Lee, Gwangju (KR)

(73) Assignee: JMJ Korea Co., Ltd., Bucheon-si (KR)

(*) Notice: Subject to any disclaimer, the term of this patent is extended or adjusted under 35 U.S.C. 154(b) by 5 days.

(21) Appl. No.: 16/847,696

(22) Filed: Apr. 14, 2020

(65) Prior Publication Data

US 2020/0388588 A1 Dec. 10, 2020

(30) Foreign Application Priority Data

Jun. 4, 2019 (KR) .................. 10-2019-0066172
Jul. 3, 2019 (KR) .................. 10-2019-0079889
Feb. 13, 2020 (KR) .................. 10-2020-0017842

(51) Int. Cl.
*H01L 29/40* (2006.01)
*H01L 21/44* (2006.01)
(Continued)

(52) U.S. Cl.
CPC .......... *H01L 24/40* (2013.01); *H01L 23/3114* (2013.01); *H01L 23/49513* (2013.01);
(Continued)

(58) Field of Classification Search
CPC .................. H01L 23/0603–06051; H01L 23/0901–09183
(Continued)

(56) References Cited

U.S. PATENT DOCUMENTS 7,525,184 B2 * 4/2009 Shimanuki ............ H01L 21/565
257/678
9,704,797 B2 * 7/2017 Lu ..................... H01L 23/49866
(Continued)

FOREIGN PATENT DOCUMENTS

JP 2574510 B2 1/1997
JP 2013-219373 A 10/2013
(Continued)

*Primary Examiner* — Calvin Lee
(74) *Attorney, Agent, or Firm* — Park, Kim & Suh, LLC

(57) ABSTRACT

A semiconductor package according to an embodiment of the present invention Includes: a lead frame comprising a pad and a lead spaced apart from the pad by a regular interval; a semiconductor chip adhered on the pad; and a clip structure electrically connecting the semiconductor chip and the lead, wherein an one end of the clip structure connected to the semiconductor chip inclines with respect to upper surfaces of chip pads of the semiconductor chip and is adhered to the upper surfaces of the chip pads of the semiconductor chip. A semiconductor package according to another embodiment of the present invention includes: a semiconductor chip comprising one or more chip pads; one or more leads electrically connected to the chip pads; and a sealing member covering the semiconductor chip, wherein an one end of the lead inclines with respect to one surface of the chip pad and is adhered to the chip pad and an other end of the lead is exposed to the outside of the sealing member.

18 Claims, 22 Drawing Sheets

(51) Int. Cl.
*H01L 23/00* (2006.01)
*H01L 23/495* (2006.01)
*H01L 23/31* (2006.01)

(52) U.S. Cl.
CPC .. *H01L 23/49524* (2013.01); *H01L 23/49562* (2013.01); *H01L 2224/40091* (2013.01); *H01L 2224/40245* (2013.01); *H01L 2224/40499* (2013.01); *H01L 2924/0105* (2013.01); *H01L 2924/01029* (2013.01); *H01L 2924/01047* (2013.01); *H01L 2924/01079* (2013.01); *H01L 2924/01082* (2013.01); *H01L 2924/1033* (2013.01); *H01L 2924/13064* (2013.01)

(58) Field of Classification Search
USPC ................ 438/611–617, 666; 257/672–676, 257/735–737, 782–786
See application file for complete search history.

(56) References Cited

U.S. PATENT DOCUMENTS

| | | | |
|---|---|---|---|
| 10,366,958 B2* | 7/2019 | Bonifield | H01L 25/0655 |
| 10,692,917 B2* | 6/2020 | Tu | H01L 24/48 |
| 2015/0155227 A1* | 6/2015 | Harata | H01L 23/50 |
| | | | 257/77 |

FOREIGN PATENT DOCUMENTS

| | | |
|---|---|---|
| JP | 2014-143326 A | 8/2014 |
| JP | 2014-192292 A | 10/2014 |
| JP | 2015-012065 A | 1/2015 |
| KR | 10-2001-0111736 A | 12/2001 |
| KR | 10-0685253 B1 | 2/2007 |
| KR | 10-2008-0038180 A | 5/2008 |
| KR | 10-2014-0073241 A | 6/2014 |
| KR | 10-2016-0033870 A | 3/2016 |

\* cited by examiner

SEMICONDUCTOR PACKAGE

CROSS-REFERENCE TO RELATED PATENT APPLICATION

This application claims the benefit of Korean Patent Application No. 10-2019-0066172, filed on Jun. 4, 2019, Korean Patent Application No. 10-2019-0079889, filed on Jul. 3, 2019, and Korean Patent Application No. 10-2020-0017842, filed on Feb. 13, 2020 in the Korean Intellectual Property Office, the disclosure of which is incorporated herein in its entirety by reference.

BACKGROUND OF THE INVENTION

1. Field of the Invention

The present invention relates to a semiconductor package, and more particularly, to a semiconductor package in which a clip may be easily adhered to a pad area, even if a size of the pad area becomes smaller, and a sufficient adhesive force between the clip and the pad area may maintain.

In addition, the present invention relates to a semiconductor package, and more particularly, to a semiconductor package in which a lead may be easily adhered to a chip pad, even if a size of the chip pad becomes smaller and a sufficient adhesive force between the lead and the chip pad may easily maintain.

2. Description of the Related Art

In general, a semiconductor package includes a semiconductor chip, a lead frame (or a board), and a package body, wherein the semiconductor chip is adhered to a pad of the lead frame and is electrically connected to a lead of the lead frame by bonding a metal wire.

However, in a stack package using a general metal wire, an electrical signal interchange is accomplished through the metal wire. Accordingly, speed is low and a large number of wires is used so that deterioration of electrical properties may occur in each chip.

In addition, an additional surface is required in a board to include a metal wire so that a size of a package increases. Also, a gap used to bond wires is required in bonding pads of each chip so that an entire height of a package unnecessarily increases.

Therefore, an effective package structure is developed by using a metal clip structure, wherein the package structure shows excellent performance in electrical connection, facilitates thermal emission, and has increased thermal stability, compared to a semiconductor package using a general metal wire.

However, since a clip is a flat type and is adhered to an upper pad of a chip, an adhering area widens.

In particular, a semiconductor used in 5G communication mainly uses a GaN material and the semiconductor using the GaN material has an improved communication property as an area of a pad to which a clip is adhered is reduced. However, it is hard for a general clip structure to adhere a clip to a pad having a reduced size.

SUMMARY OF THE INVENTION

The present invention provides a semiconductor package including a GaN material in which a clip may be easily adhered to a pad area, even if a size of the pad area becomes smaller, and a sufficient adhesive force between the clip and the pad area may maintain.

The present invention also provides a semiconductor package including a GaN material in which a lead may be easily adhered to a chip pad, even if a size of the chip pad becomes smaller, and a sufficient adhesive force between the semiconductor chip and the lead may maintain.

According to an aspect of the present invention, there is provided a semiconductor package including: a lead frame comprising a pad and a lead spaced apart from the pad by a regular interval; a semiconductor chip adhered on the pad; and a clip structure electrically connecting the semiconductor chip and the lead, wherein an one end of the clip structure connected to the semiconductor chip inclines with respect to upper surfaces of chip pads of the semiconductor chip and is adhered to the upper surfaces of the chip pads of the semiconductor chip.

An edge formed after a lower surface of the clip structure meets a cut surface of the clip structure may be adhered toward the upper surfaces of the chip pads of the semiconductor chip.

A first angle between the lower surface and the upper surfaces of the chip pads and a second angle between the cut surface and the upper surfaces of the chip pads may be in the range of 10 to 85 degrees.

The lower surface and the cut surface may incline at a regular angle in the edge and a cross-section of the edge cut along a longitudinal direction of the edge may be in a V shape or a U shape.

The edge may be filled in a third adhesive layer and contact the third adhesive layer along with the lower surface and the cut surface.

The third adhesive layer may include at least one of Sn, Pb, Ag, Cu, and Au.

The third adhesive layer may connect the one end of the clip structure to the chip pads by using a soldering.

The lead may include a first lead and a second lead, both of which are placed at an opposite side centering around the pad, the first lead may be electrically connected to a gate of the semiconductor chip, and the second lead may be electrically connected to a drain of the semiconductor chip.

The pad may include at least one or more first penetration holes and the lead may include at least one or more of second penetration holes.

The lead may include at least one or more second concaved parts interposed between the pad and the second penetration holes.

The semiconductor chip may include a GaN semiconductor.

The lower surface and the cut surface may incline at a regular angle in the edge and at least a part of a cross-section of the edge cut along a longitudinal direction of the edge may contact the upper surfaces of the chip pads of the semiconductor chip.

The cross-section formed by cutting the edge may be formed to contact the upper surfaces of the chip pads of the semiconductor chip in a width direction with the rate of 0.3 to 0.5:1.

The lower surface and the cut surface may incline at a regular angle in the edge and a cross-section of the edge cut along a longitudinal direction of the edge may be formed to be a chamfer and contacts the upper surfaces of the chip pads of the semiconductor chip.

The edge may be filled in the third adhesive layer and thus, the lower surface, the cut surface, and at least a part of the cross-section of the edge cut along a longitudinal direction of the edge may simultaneously contact the third adhesive layer.

According to another aspect of the present invention, there is provided a semiconductor package including: a semiconductor chip comprising one or more chip pads; one or more leads electrically connected to the chip pads; and a sealing member covering the semiconductor chip, wherein an one end of the lead inclines with respect to one surface of the chip pad and is adhered to the chip pad and an other end of the lead is exposed to the outside of the sealing member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more specifically with reference to the accompanying drawings in which some exemplary embodiments are shown so as for one of ordinary skill in the art to easily execute the embodiments of the present invention. The present invention may be embodied in many different forms and should not be construed as being limited to the embodiments set forth herein.

Figure 1:
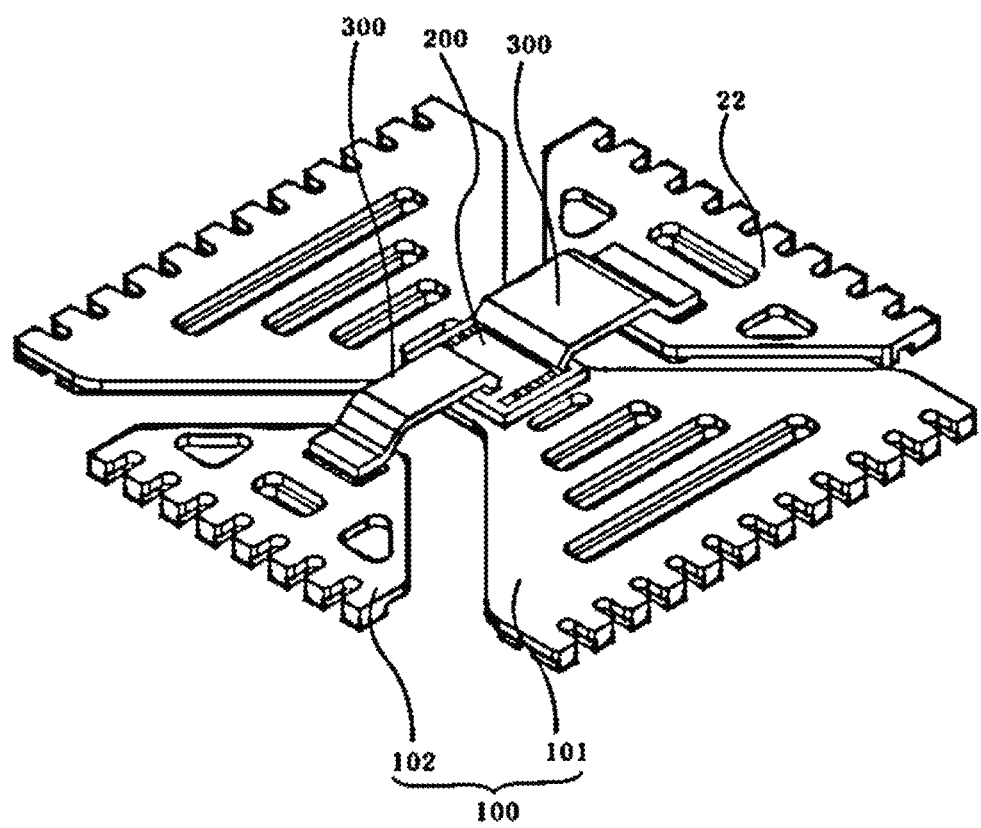
FIG. 1 is a perspective view schematically illustrating a semiconductor package according to an embodiment of the present invention.
Figure 2:
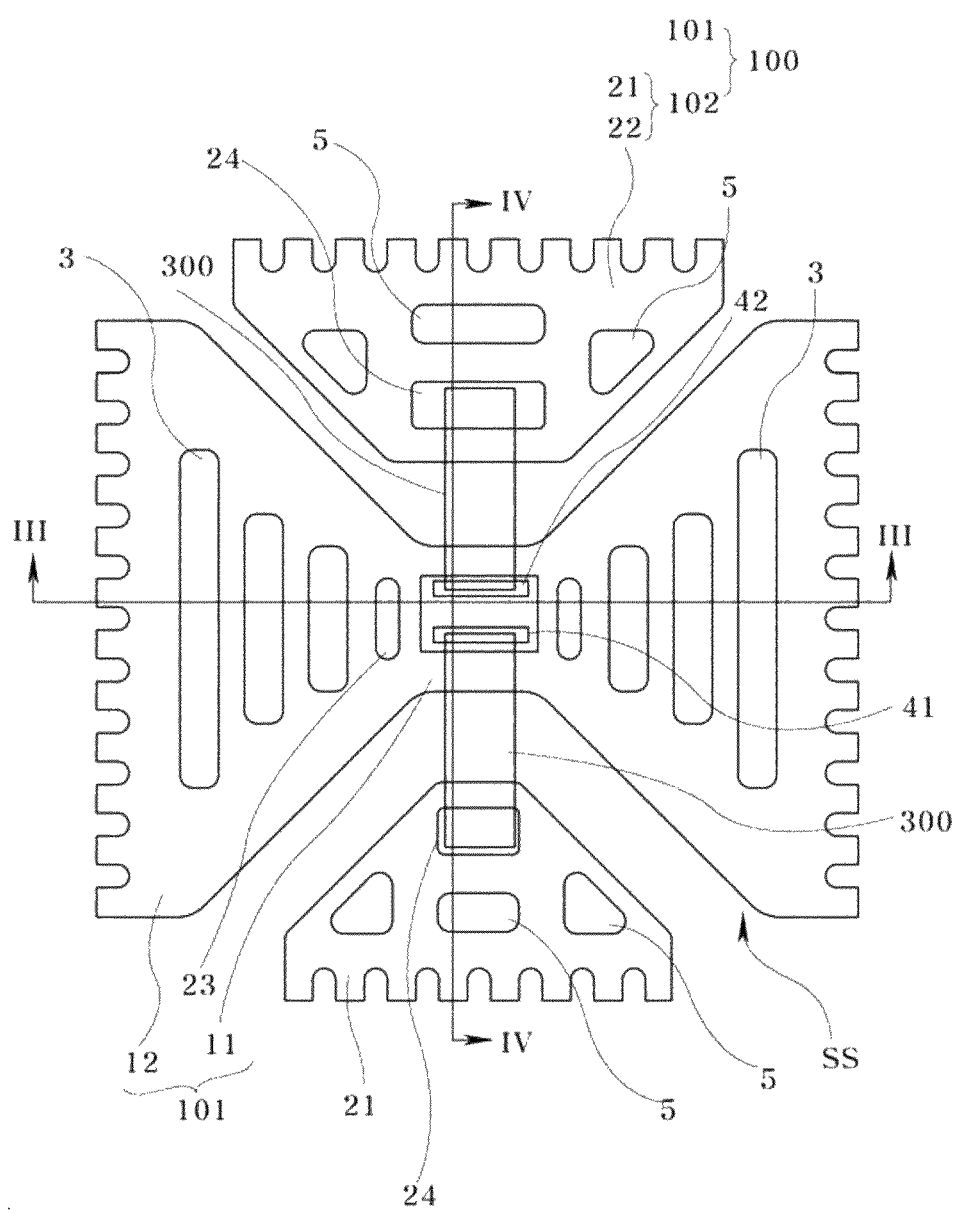
FIG. 2 is an arrangement plan of the semiconductor package of FIG. 1 according to an embodiment of the present invention.
Figure 3:
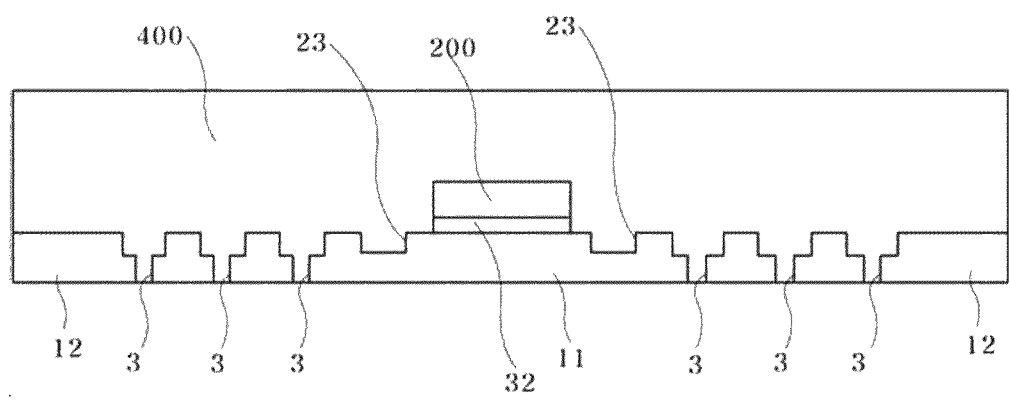
FIG. 3 is a cross-sectional view of the semiconductor package of FIG. 1 cut along a line III-III of FIG. 2.
Figure 4:
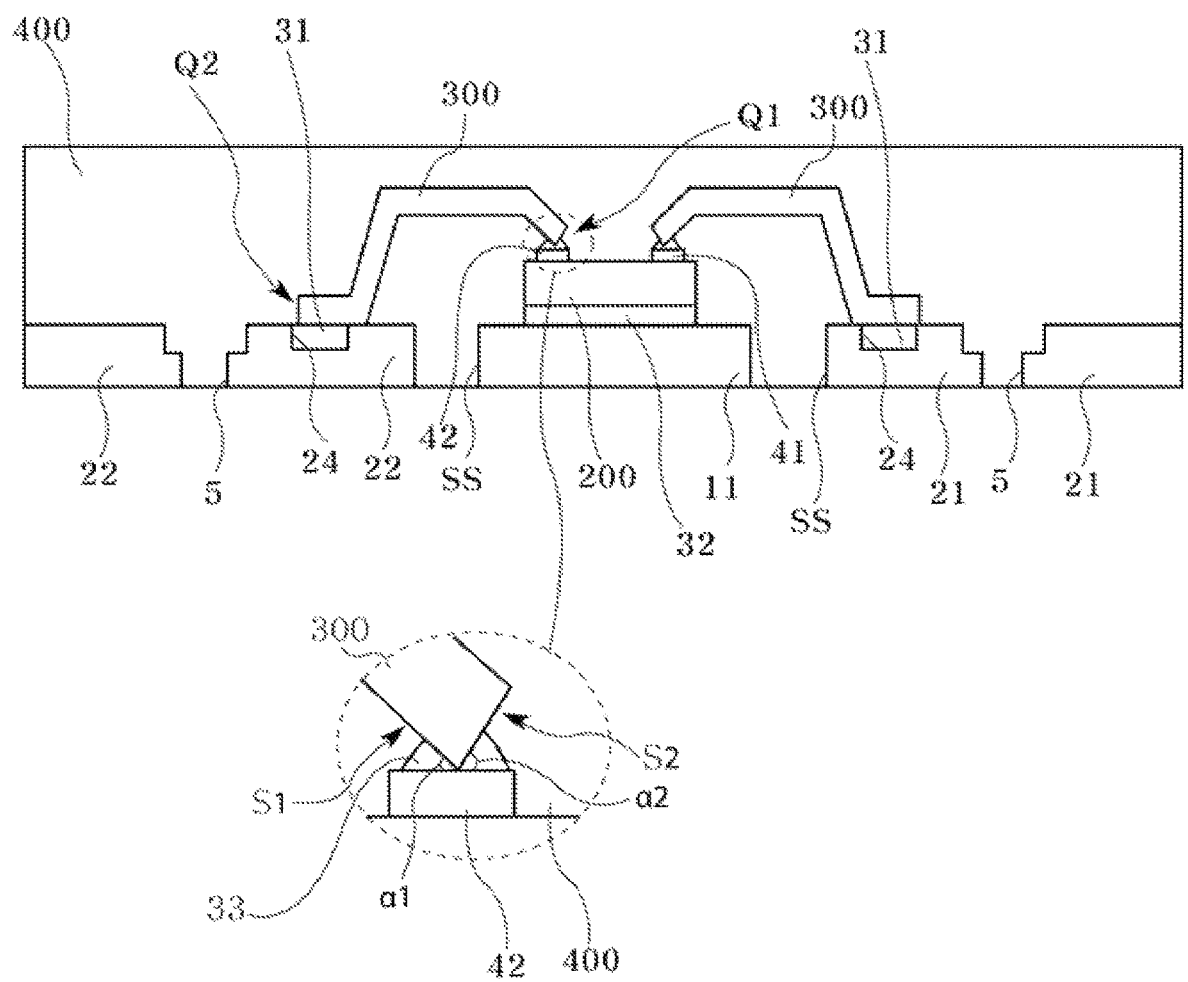
FIG. 4 is a cross-sectional view of the semiconductor package of FIG. 1 cut along a line IV-IV of FIG. 2.
Figure 5:
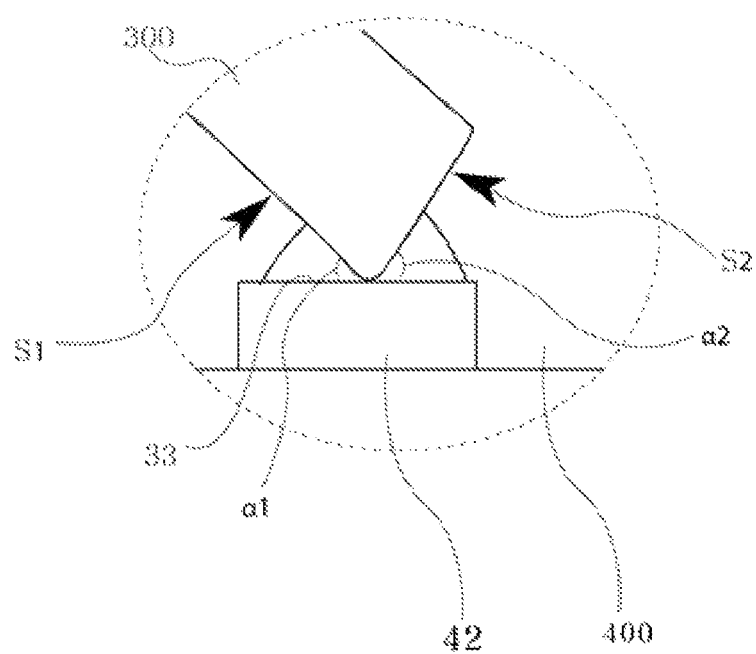
FIG. 5 is a cross-sectional view illustrating an enlarged part of a semiconductor package according to another embodiment of the present invention.

FIG. 1 is a perspective view schematically illustrating a semiconductor package according to an embodiment of the present invention, FIG. 2 is an arrangement plan of the semiconductor package of FIG. 1 according to an embodiment of the present invention, FIG. 3 is a cross-sectional view of the semiconductor package of FIG. 1 cut along a line III-III of FIG. 2, FIG. 4 is a cross-sectional view of the semiconductor package of FIG. 1 cut along a line IV-IV of FIG. 2, and FIG. 5 is a cross-sectional view illustrating an enlarged part of a semiconductor package according to another embodiment of the present invention.

As illustrated in FIGS. 1 through 4, the semiconductor package according to an embodiment of the present invention may be used as a power amplifier for base stations of mobile communication, a power amplifier for automobiles, marine radar, and a power amplifier for air traffic control radar and is not limited thereto.

The semiconductor package according to the present invention includes a lead frame 100, a semiconductor chip 200 placed on the lead frame 100, and a clip structure 300 electrically connecting the semiconductor chip 200 to the lead frame 100.

The lead frame 100 includes a pad 101, on which the semiconductor chip 200 is placed, and a lead 102 electrically connected to the semiconductor chip 200.

The pad 101 includes a first part 11 and a second part 12, wherein the semiconductor chip 200 is directly placed on the first part 11, and the second part 12 is placed at the opposite side centering around the first part 11 and is symmetrical. The first part 11 is formed to have a regular width and may be a quadrangle. Also, the width of the second part 12 may increase as the second part 12 places far apart from the first part 11. Accordingly, a plane shape of the pad 101 may be a sandglass or a butterfly shape.

The second part 12 includes a plurality of first penetration holes 3, wherein the first penetration holes 3 are long holes having lengths extended in one direction and may be arranged at regular intervals. The first penetration holes 3 may be arranged for the lengths thereof to gradually increase according to the width of the second part 12.

The lead 102 includes a first lead 21 and the second lead 22, wherein the first lead 21 is electrically connected to a gate and the second lead 22 is electrically connected to a drain. The first and second leads 21 and 22 may have the same plane shape or the second lead 22 electrically connected to a drain may be greater than the first lead 21.

The lead 102 is engaged with a concaved part SS formed according to the first part 11 and the second part 12 and the width of the lead 102 may increase as the lead 102 places far apart from the pad 101. Here, the lead 102 and the pad 101 are spaced apart from each other at a regular interval so as not to be electrically connected to each other. Accordingly, border lines where the lead 102 and the pad 101 face each other may be parallel to each other.

The lead 102 includes a plurality of second penetration holes 5, wherein the second penetration holes 5 may be long holes having lengths extended in one direction, however, is not restricted thereto. The second penetration holes 5 may have any form if an adhesive property may increase and may have, for example, a triangle shape when the second penetration holes 5 are placed at the corner of the lead 102.

The first and second penetration holes 3 and 5 are filled with an Epoxy Mold Compound (EMC) sealing material 400 and thus, a lower contact surface of the EMC sealing material 400 increases so that an adhesive force may be increased. In addition, inner walls of the first and second penetration holes 3 and 5 may have a step structure in order to increase an adhesive force with the EMC sealing materials 400.

The pad 101 and the lead 102 may respectively include a first concaved part 23 and a second concaved part 24, wherein the first concaved part 23 may be interposed between the pad 101 and the first penetration holes 3 and the second concaved part 24 may be interposed between the pad 101 and the second penetration holes 5.

A first adhesive layer 31 is filled with the second concaved part 24 for adhering the clip structure 300 and a sufficient amount of an adhesive layer is formed for the clip structure 300 to strongly adhere to the first adhesive layer 31.

The first adhesive layer 31 is a conductive adhesive and may be formed of a solder base material including Sn or Pb, a sintering material including Ag and Cu, and an eutectic reaction material including Au.

The semiconductor chip 200 is placed on the first part 11 and may be adhered to the pad 101 through a second adhesive layer 32.

The semiconductor chip 200 includes a GaN semiconductor and may include a source, a GaN semiconductor layer, a gate, and a drain, wherein the source, the gate, the drain respectively include a chip pad for the source, a chip pad for the gate, and a chip pad for the drain.

The chip pad for the source (not illustrated) is placed straightly above the pad 101 of the lead frame 100 and is electrically connected to the pad 101 through the second adhesive layer 32. Also, each of the chip pad 41 for the gate and the chip pad 42 for the drain is electrically connected to a first lead 21 and a second lead 22 through the clip structure 300.

The second adhesive layer 32 is a conductive adhesive and may be formed of a solder base material including Sn or Pb, a sintering material including Ag and Cu, and an eutectic reaction material including Au.

The clip structure 300 is a metal band having a regular width, wherein one end thereof is electrically connected to the chip pads 41 and 42 formed on the semiconductor chip 200 using a metal and the other end thereof may be electrically connected to the lead 102. The clip structure 300 is bent to connect the chip pads 41 and 42 and the lead 102, which are placed at each different height, and thus may be an arch shape.

More specifically, one end Q1 of the clip structure 300 may incline and contact the upper surfaces of the chip pads 41 and 42 of the semiconductor chip 200. Here, the clip structure 300 inclines and contacts the upper surfaces of the chip pads 41 and 42 in such a way that an edge formed after a lower surface S1 of the clip structure 300 meets a cut surface S2 of the clip structure 300 is adhered toward the upper surfaces of the chip pads 41 and 42 of the semiconductor chip 200.

The expression "incline and contact" disclosed in the present invention denotes that the one end Q1 of the clip structure 300 directly contacts one surfaces of the chip pads 41 and 42 of the semiconductor chip 200 and thereby, line-contact or surface-contact may be accomplished. Also, as will be described below, a third adhesive layer 33 may be used as a medium to electrically connect the one end Q1 of the clip structure 300 to the one surfaces of the chip pads 41 and 42 of the semiconductor chip 200 (refer to drawings on the left of FIGS. 6 and 7). More specifically, an interval between the one end Q1 of the clip structure 300, that is, the edge formed after the lower surface S1 of the clip structure 300 meets the cut surface S2 of the clip structure 300, and the one surfaces of the chip pads 41 and 42 of the semiconductor chip 200 may be in the range of 0 to 70 um.

A first angle $\alpha 1$ between the upper surfaces of the chip pads 41 and 42 and the lower surface S1 of the clip structure 300 and a second angle $\alpha 2$ between the upper surfaces of the chip pads 41 and 42 and the cut surface S2 of the clip structure 300 may be in the range of 10 to 85 degrees.

Here, the lower surface S1 faces and meets the cut surface S2 to have a regular angle and to form a V shape, however, the present invention is not limited thereto. As illustrated in FIG. 5, a part where the lower surface S1 meets the cut surface S2 may have a r value and thus, a part contacting the chip pads 41 and 42 may have a round shape. Even if the part has a round shape, the chip pads 41 and 42 contact a part projected most and thus, line-contact may be accomplished.

As such, if the lower surface S1 of the clip structure 300 or the cut surface S2 of the clip structure 300 is formed to incline at a regular angle with respect to the upper surfaces of the chip pads 41 and 42, the one end Q1 of the clip structure 300 is partially embedded in the third adhesive layer 33 interposed between the clip structure 300 and the chip pads 41 and 42. Accordingly, even if areas of the chip pads 41 and 42 decrease, a contact area may be sufficiently secured and thereby, an adhesive force may increase.

The third adhesive layer 33 is formed of a conductive metal and may be connected to the clip structure 300 by using soldering, wherein the conductive metal may include, for example, at least one of Sn, Pb, Ag, Cu, and Au.

An other end Q2 of the clip structure 300 may surface-contact to the first adhesive layer 31. The first adhesive layer 31 placed in the lead 102 is sufficiently filled in the second concaved part 24 and thus, may be stably fixed to the other end Q2 of the clip structure 300.

The clip structure 300 is used to electrically connect the semiconductor chip 200 to the lead 102 and thus, may include Al, Cu, Au, or Ag having excellent conductivity.

Figure 6:
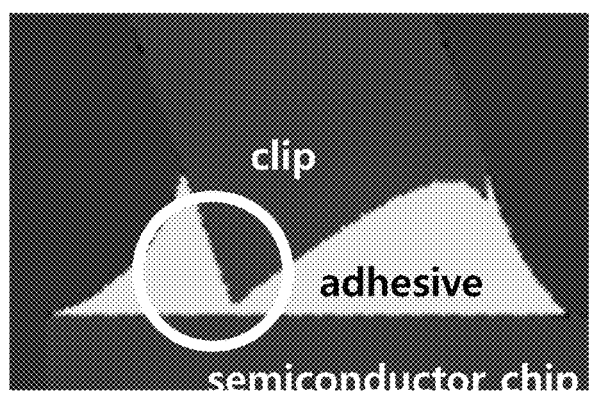
FIGS. 6 and 7 are respectively a picture illustrating one end of a clip structure adhered to an adhesive layer and its simulation view according to an embodiment of the present invention.
Figure 6:
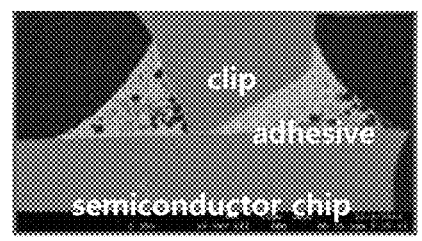
Figure 7:
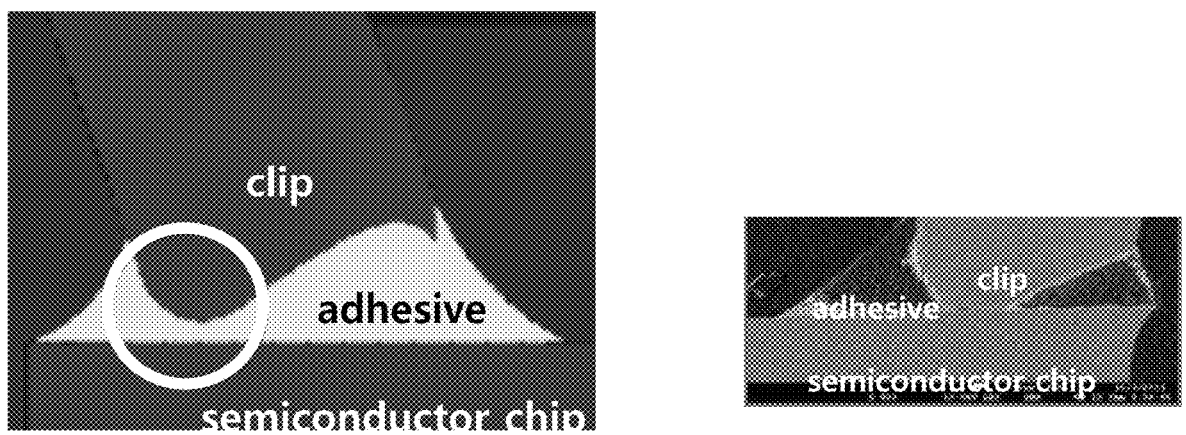

FIGS. 6 and 7 are respectively a picture illustrating the one end Q1 of the clip structure 300 adhered to the third adhesive layer 33 and its simulation view according to an embodiment of the present invention.

Referring to FIGS. 6 and 7, the clip structure 300 inclines with respect to the upper surfaces of the chip pads 41 and 42 and the third adhesive layer 33 contact the lower surface S1 and the cut surface S2 of the clip structure 300. Accordingly, a contact area may be sufficiently secured and thereby, the clip structure 300 may be stably fixed to the chip pads 41 and 42.

Figure 8A:
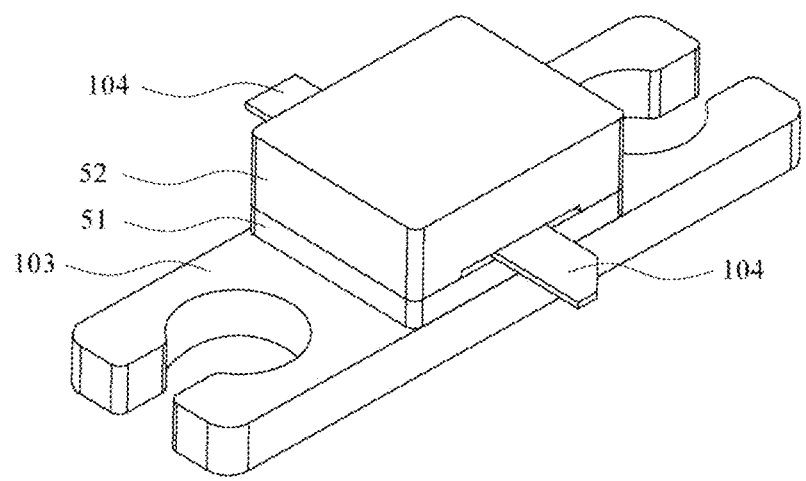
FIGS. 8A and 8B are perspective views schematically illustrating a semiconductor package according to another embodiment of the present invention.
Figure 8B:
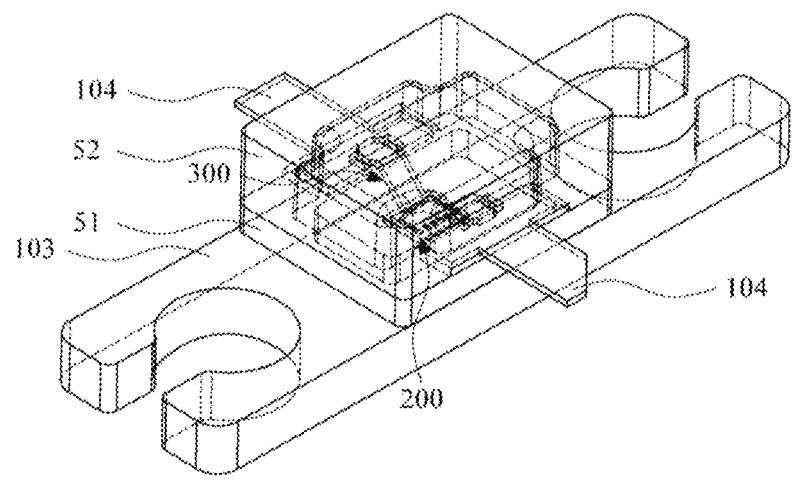
Figure 9:
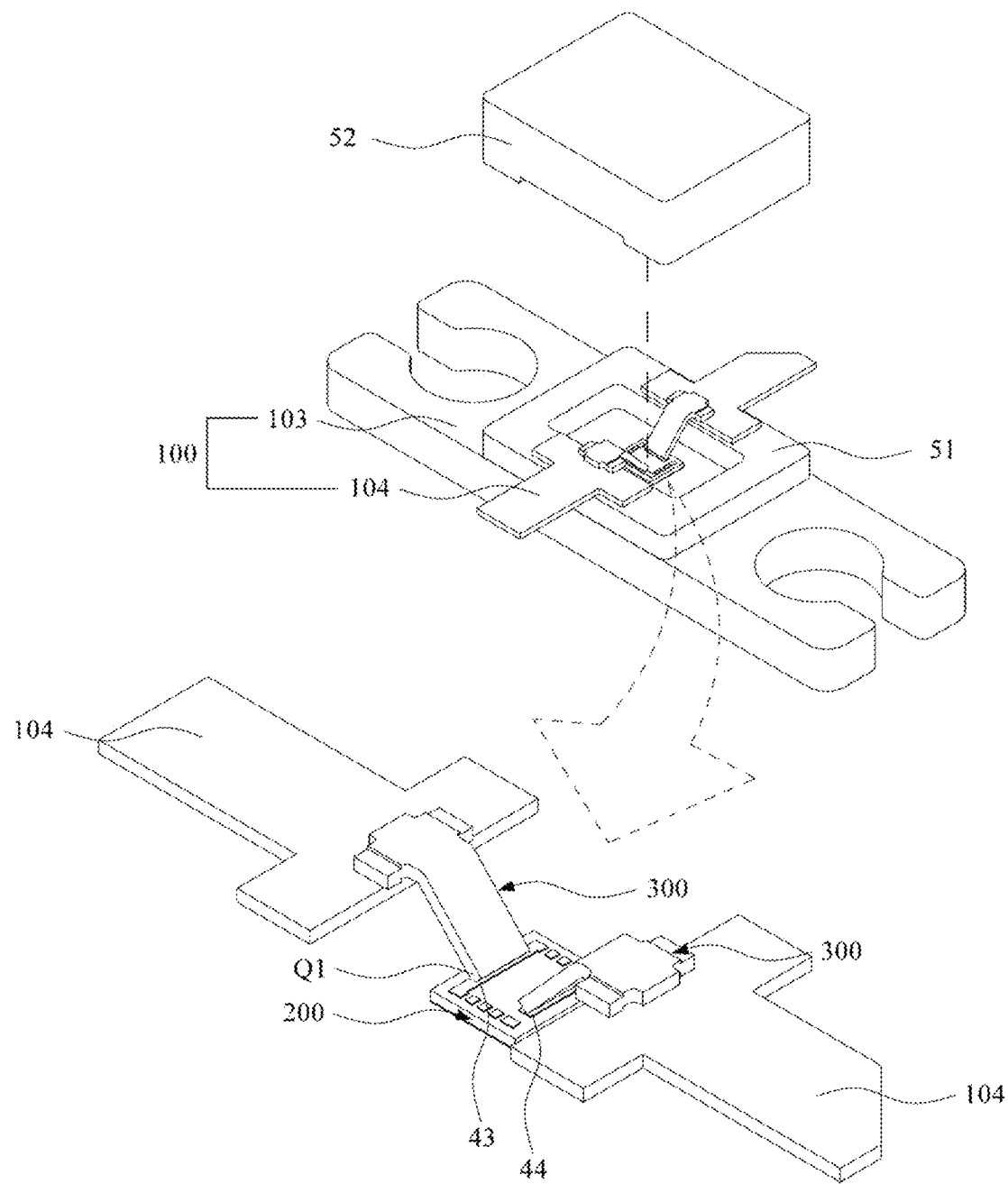
FIG. 9 is an exploded perspective view of the semiconductor package of FIGS. 8A and 8B.

FIGS. 8A and 8B are perspective views schematically illustrating a semiconductor package according to another embodiment of the present invention, FIG. 9 is an exploded perspective view of the semiconductor package of FIGS. 8A and 8B, and FIGS. 10 through 12 are cross-sectional views of the semiconductor package of FIGS. 8A and 8B.

As illustrated in FIGS. 8A, 8B and 9, a semiconductor package according to another embodiment of the present invention includes a pad 103, the lead frame 100 including a lead 104 spaced apart from the pad 103 by a regular interval, the semiconductor chip 200 adhered to the pad 103, and the clip structure 300 electrically connecting the semiconductor chip 200 to the lead 104, wherein the one end Q1 of the clip structure 300 connected to the semiconductor chip 200 inclines and contacts the upper surfaces of chip pads 43 and 44 of the semiconductor chip 200

Figure 10:
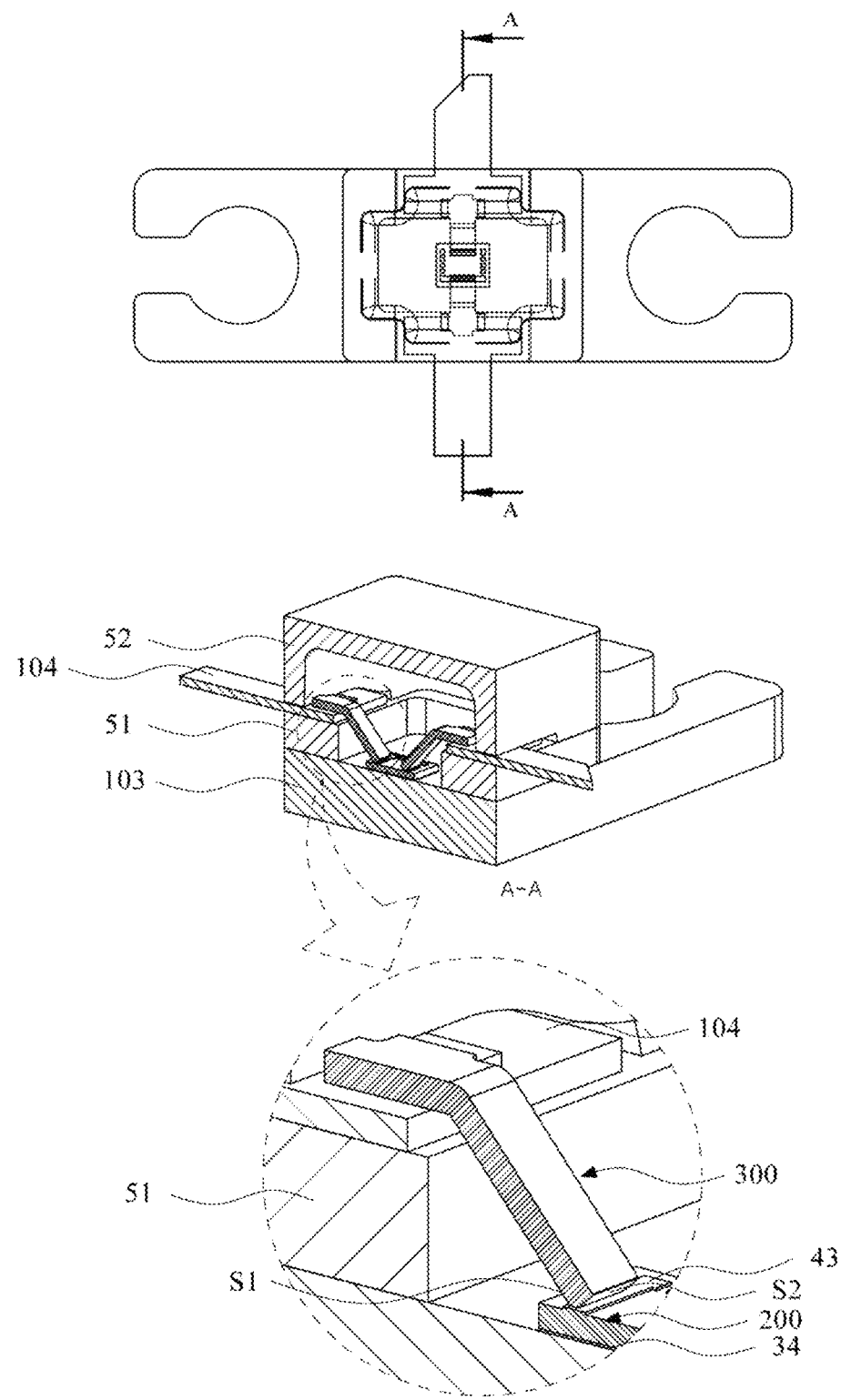
FIGS. 10 through 12 are cross-sectional views of the semiconductor package of FIGS. 8A and 8B.
Figure 11:
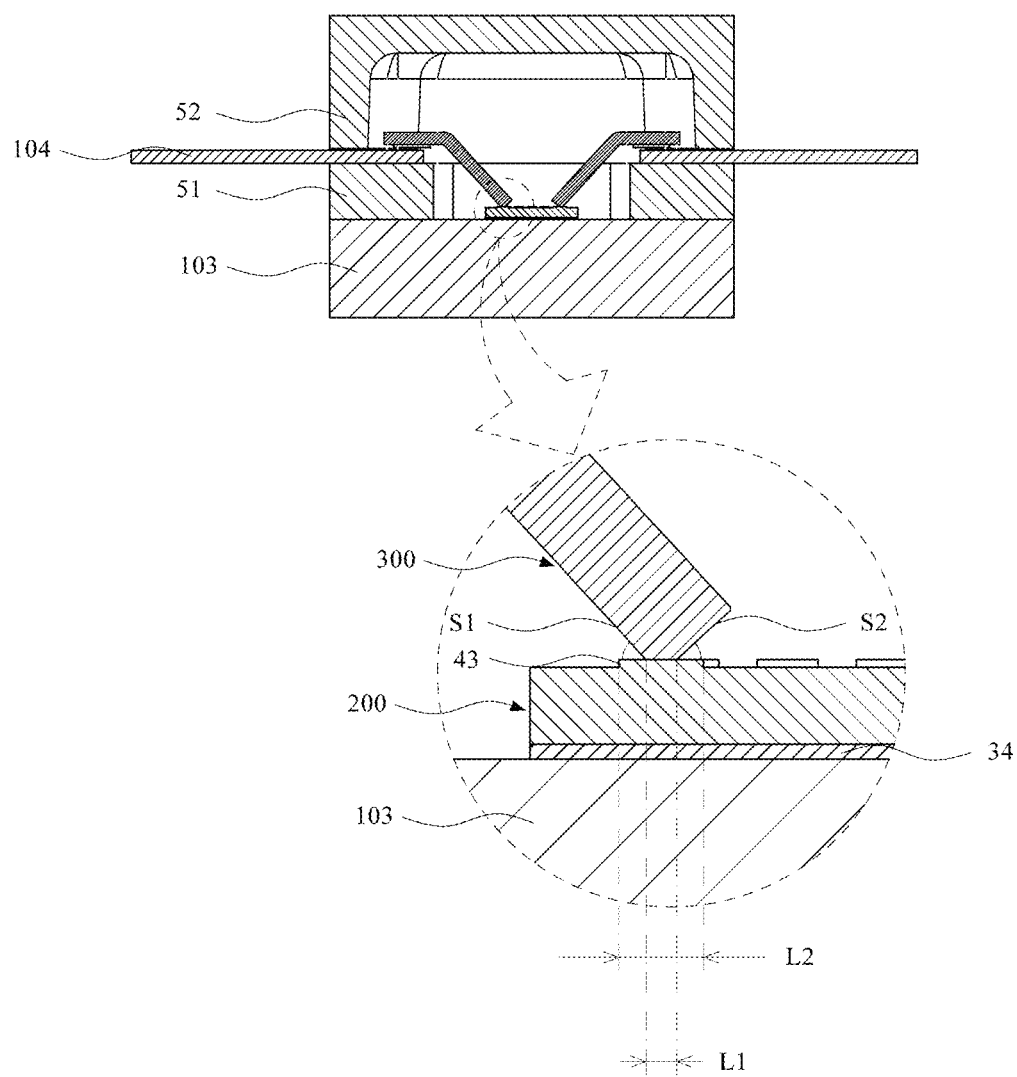

Here, referring to FIGS. 10 and 11, the edge formed after the lower surface S1 of the clip structure 300 meets the cut surface S2 of the clip structure 300 may be adhered to face the upper surfaces of the chip pads 43 and 44 of the semiconductor chip 200. A first angle α1 between the upper surfaces of the chip pads 43 and 44 and the lower surface S1 of the clip structure 300 and a second angle α2 between the upper surfaces of the chip pads 43 and 44 and the cut surface S2 of the clip structure 300 may be in the range of 10 to 85 degrees.

The one end Q1 of the clip structure 300 is electrically connected to the chip pads 43 and 44 and the other end of the clip structure 300 is electrically connected to the lead 104. In order to electrically connect the chip pads 43 and 44 to the lead 104 which are placed at each different height, the clip structure 300 may be formed by bending.

More specifically, the lower surface S1 and the cut surface S2 incline at a regular angle in the edge and at least a part of a cross-section L1 of the edge cut along a longitudinal direction of the edge may be formed to surface-contact the upper surfaces of the chip pads 43 and 44 of the semiconductor chip 200. Also, the cross-section L1 formed by cutting the edge may be formed to contact an upper surface L2 of the chip pad 43 and 44 of the semiconductor chip 200 in a width direction with the rate of 0.3 to 0.5:1.

In addition, the lower surface S1 and the cut surface S2 incline at a regular angle in the edge and a cross-section of the edge cut along a longitudinal direction of the edge may be formed to be a chamfer. Then, the cross-section of the edge may contact the entire upper surface of the chip pads 43 and 44 of the semiconductor chip 200.

That is, a part of the cross-section formed by cutting the clip structure 300 may only surface-contact the upper surfaces of the chip pads 43 and 44 or the entire cross-section may be chamfered to surface-contact the upper surfaces of the chip pads 43 and 44.

As described above, line-contact may be accomplished by the third adhesive layer 33 between a V shape or a U shape edge and the chip pads 41 and 42. In addition, the one end Q1 of the clip structure 300 may be electrically connected to the upper surfaces of the chip pads 43 and 44 of the semiconductor chip by using the third adhesive layer 33 as a medium.

Figure 12:
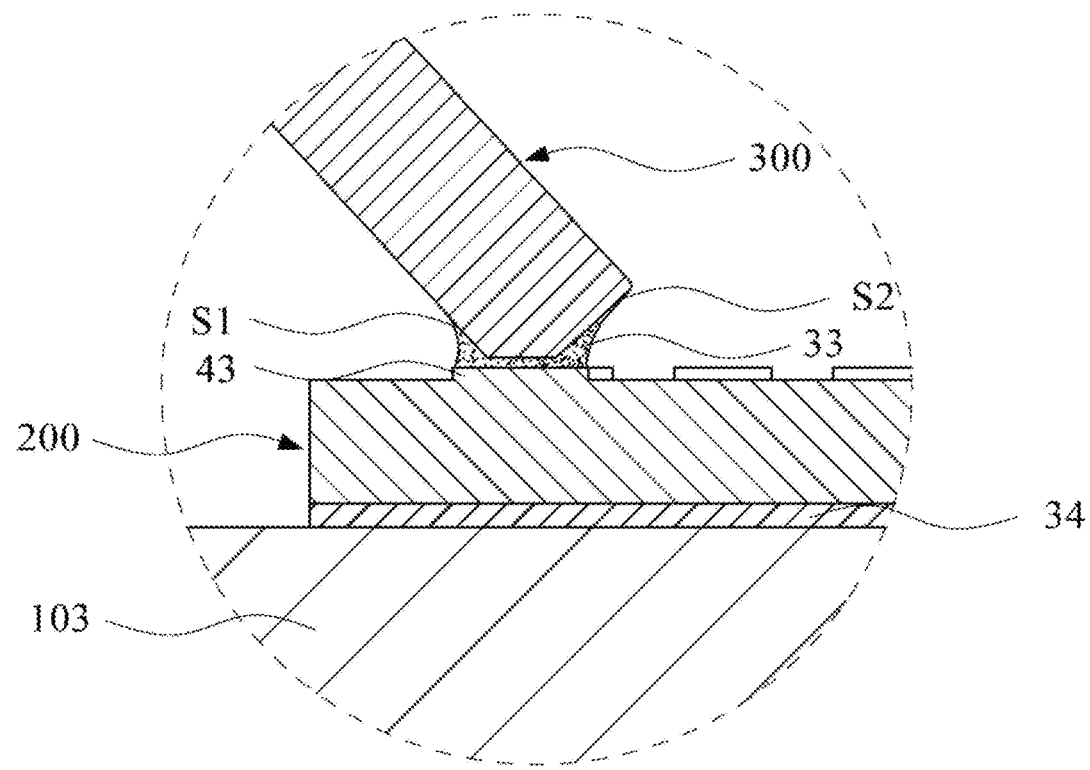

Accordingly, as illustrated in FIG. 12, the conductive third adhesive layer 33 is interposed between the clip structure 300 and the chip pad 43. In other words, the edge of the clip structure 300 is filled in the third adhesive layer 33 and thus, the lower surface S1, the cut surface S2, and at least a part of the cross-section of the edge cut along a longitudinal direction of the edge simultaneously contact the third adhesive layer 33. Therefore, an electrical contact area between the clip structure 300 and the chip pads 41 and 42 may be sufficiently secured. Also, due to surface-contact between the clip structure 300 and the chip pads 43 and 44, an electrical contact area may be sufficiently secured and a fixation area may be stably secured.

The pad 103 may be a pad of a lead frame or a pad of a board and the lead 104 is a terminal lead. A lower ceramic case 51 is placed on the upper part of the pad 103. The pad 103 and the lead 104 are spaced apart from each other in a regular interval by the lower ceramic case 51. The semiconductor chip 200 is adhered to a part of the pad 103 exposed through an inner space of the lower ceramic case 51 by using a conductive adhesive 34. Then, the clip structure 300 is adhered to the semiconductor chip 200 and is protected by covering or molding an upper housing 52 on the upper part of the lower ceramic case 51 so that one end of the lead 104 is exposed to the outside.

Figure 13:
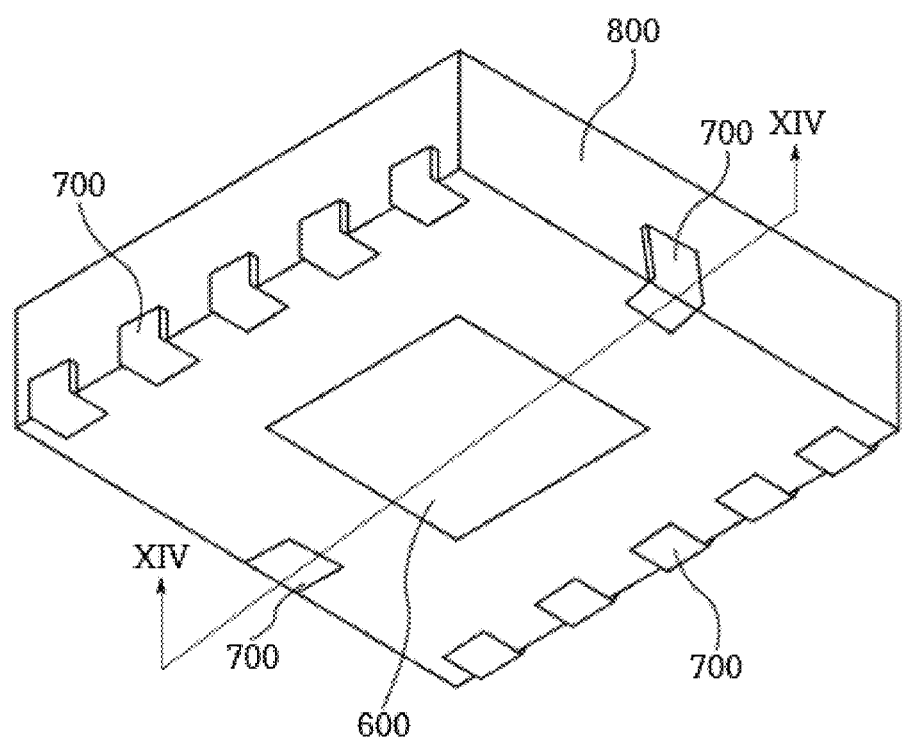
FIG. 13 is a perspective view schematically illustrating a semiconductor package according to another embodiment of the present invention.
Figure 14:
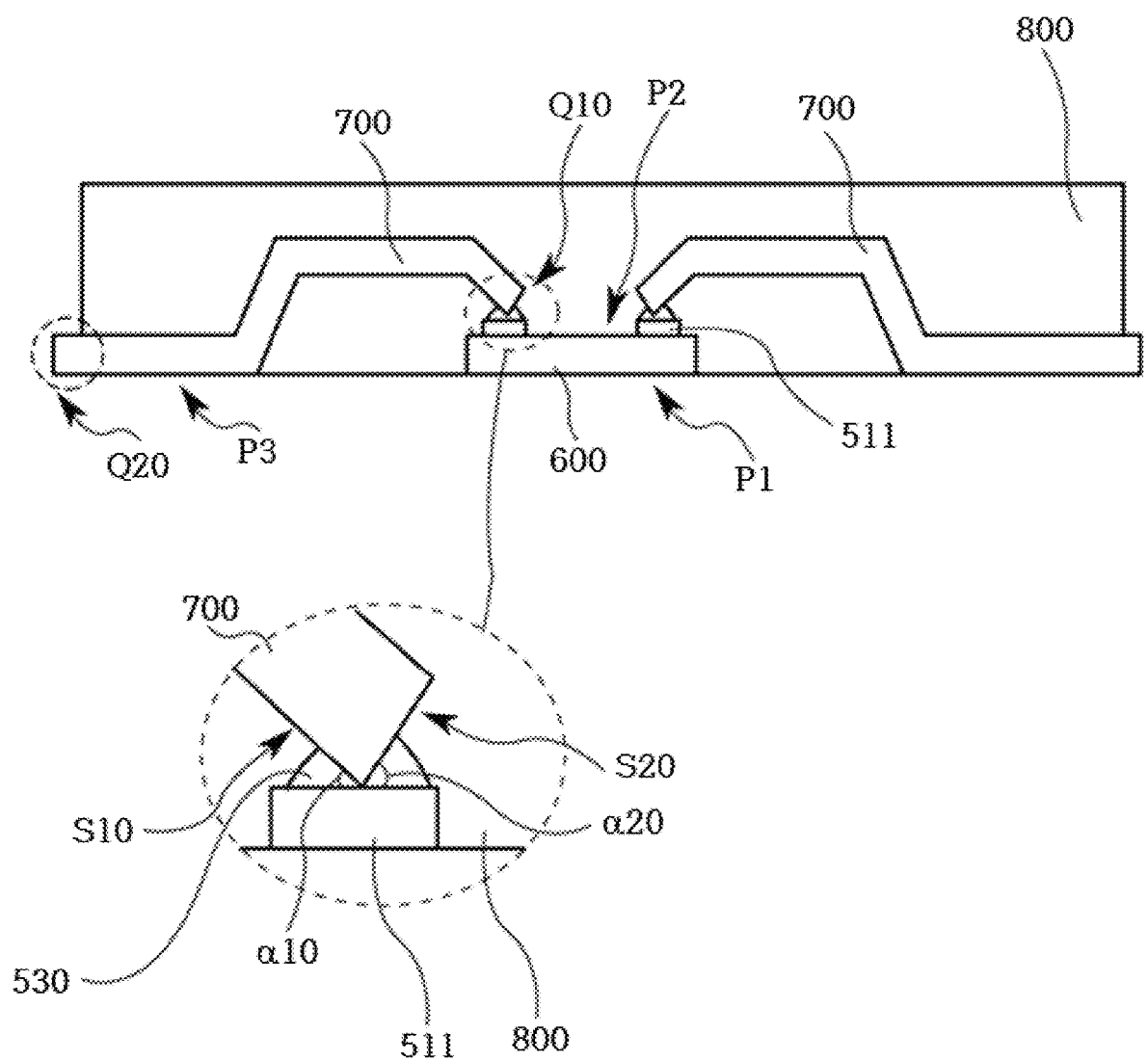
FIG. 14 is a cross-sectional view of the semiconductor package of FIG. 13 cut along a line XIV-XIV of FIG. 13.
Figure 15:
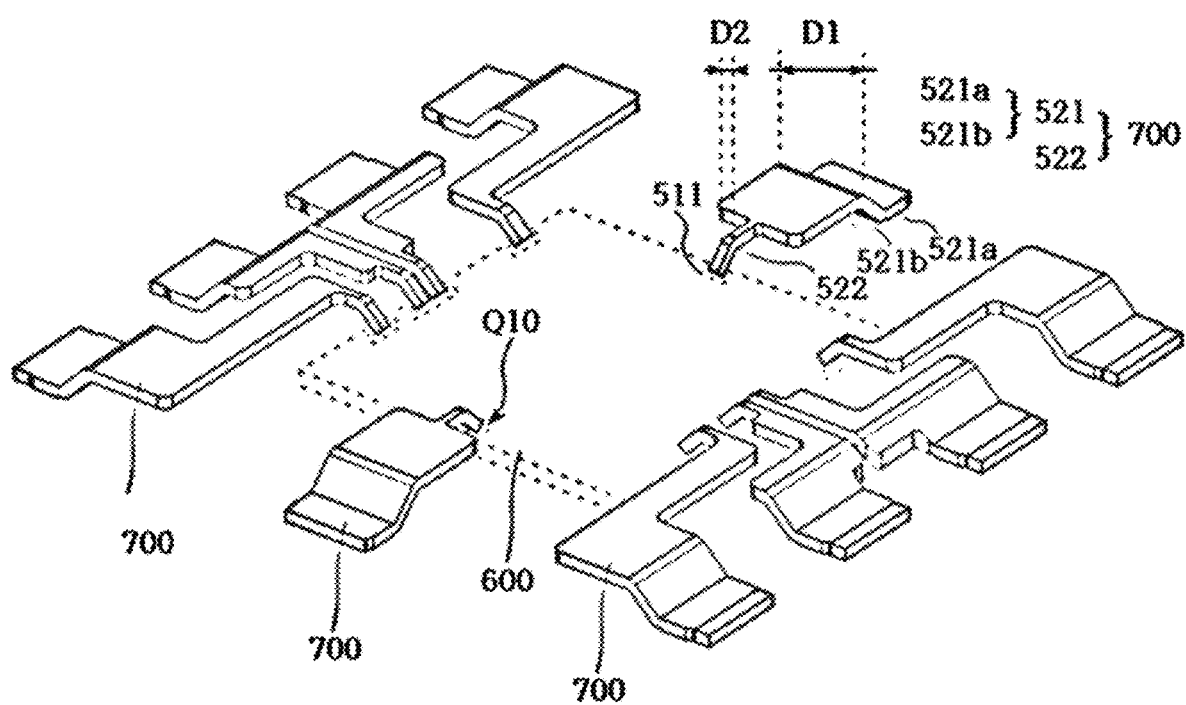
FIG. 15 is a perspective view of leads included in the semiconductor package of FIG. 13.

FIG. 13 is a perspective view schematically illustrating a semiconductor package 1001 according to another embodiment of the present invention, FIG. 14 is a cross-sectional view of the semiconductor package 1001 cut along a line XIV-XIV of FIG. 13, and FIG. 15 is a perspective view of leads 700 included in the semiconductor package 1001.

The semiconductor package 1001 according to another embodiment of the present invention may be used as a power amplifier for base stations of mobile communication, a power amplifier for automobiles, marine radar, and a power amplifier for air traffic control radar and is not limited thereto.

As illustrated in FIGS. 13 through 15, the semiconductor package 1001 includes a semiconductor chip 600, one or a plurality of leads 700 electrically connected to the semiconductor chip 600, and a sealing member 800 covering the semiconductor chip 600.

The semiconductor chip 600 includes a GaN semiconductor and may include a source, a GaN semiconductor layer, a gate, and a drain, wherein the source, the gate, the drain respectively include chip pads 511 for the source, the gate, and the drain. Here, a size of the chip pad 511 may be 500 μm or below in width and 500 μm or below in length.

The semiconductor chip 600 may be partially exposed to the outside of the sealing member 800. More specifically, the semiconductor chip 600 may include an one surface P1 exposed to the outside of the sealing member 800 and other surface P2 disposed in the sealing member 800. The semiconductor chip 600 includes the chip pad for the source on the one surface P1 and the chip pads for the gate and drain on the other surface P2, however, is not limited thereto. If necessary, the chip pad for the drain may be disposed on the one surface P1 and the chip pads for the source and gate may be disposed on the other surface P2.

A part of the semiconductor chip 600 is electrically connected to the outside. More specifically, the one surface P1 of the semiconductor chip 600 is electrically connected to the outside may be a part of the chip pad 511 including a conductive metal. Here, the conductive metal may include any one single metal from Au, Ag, Sn, Pb, or Ni or an alloy metal including at least any one metal from Au, Ag, Sn, Pb, or Ni. In addition, the conductive metal may be formed of a single layer or plural layers.

The plurality of the leads 700 may be disposed to surround the semiconductor chip 600 and according to a circuit pattern, various numbers of the leads may be disposed.

In the current embodiment, it is illustrated that the other end Q20 of the lead 700 is exposed to the outside of the sealing member 800, however, the present invention is not limited thereto. The Q20 of the lead 700 may be disposed on a virtual plane that is the same as the side of the sealing member 800 (not illustrated).

Each of the lead 700 includes a first lead member 521 having a first width D1 and a second lead member 522 having a width that is same as the first width D1 or more preferably, a second width D2 that is smaller than the first width D1, wherein the second lead member 522 is extended from the first lead member 521.

The first lead member 521 includes a flat part 521a including the other end Q20 of the lead 700 and a bending part 521b connecting the flat part 521a to the second lead member 522. The bending part 521b facilitates adhering of the second lead member 522 to the upper part of the chip pad 511 of the semiconductor chip 600.

An one surface P3 of the flat part 521a is exposed to the outside of the sealing member 800 along with the one surface P1 of the semiconductor chip 600 and may be disposed on the virtual plane that is the same as that of the one surface P1.

In addition, as another embodiment of the present invention, the one surface P3 of the flat part 521a may be filled in the sealing member 800 (not illustrated).

The second lead member 522 directly contacts the chip pad 511 disposed on the other surface P2 of the semiconductor chip 600 and has a width that is smaller than that of the first lead member 521 due to a small size of the chip pad 511. The second lead member 522 may be bent toward the chip pad 511 as in the same manner as in the bending part 521b of the first lead member 521.

An one end Q10 of the second lead member 522 may incline and contact the other surface P2 of the semiconductor chip 600. Here, the second lead member 522 inclines and contacts the upper surface of the chip pad 511 in such a way that an edge formed after an one surface S10 of the second lead member 522 meets a cut surface S20 of the second lead member 522 is adhered toward the upper surface of the chip pad 511 disposed on the other surface P2 of the semiconductor chip 600. Here, the one surface S10 of the second lead member 522 may be formed on a plane that is same as the one surface P3 of the flat part 521a and is a lower surface of the lead 700.

The expression "incline and contact" disclosed in the present invention denotes that the one end Q10 of the second lead member 522 directly contacts one surface of the chip pad 511 of the semiconductor chip 600 and thereby, line-contact may be accomplished. Also, as will be described below, an adhesive layer 530 may be used as a medium to electrically connect the one end Q10 of the second lead member 522 to the one surface of the chip pad 511 of the semiconductor chip 600 (refer to drawings on the left of FIGS. 16 and 17). More specifically, an interval between the one end Q10 of the second lead member 522, that is, the edge formed after the one surface S10 of the second lead member 522 meets the cut surface S20 of the second lead member 522, and the one surface of the chip pad 511 of the semiconductor chip 600 may be in the range of 0 to 70 um.

A first angle α10 between the upper surface of the chip pad 511 and the one surface S10 of the second lead member 522 and a second angle α20 between the upper surface of the chip pad 511 and the cut surface S20 of the second lead member 522 may be in the range of 10 to 85 degrees.

Figure 17:
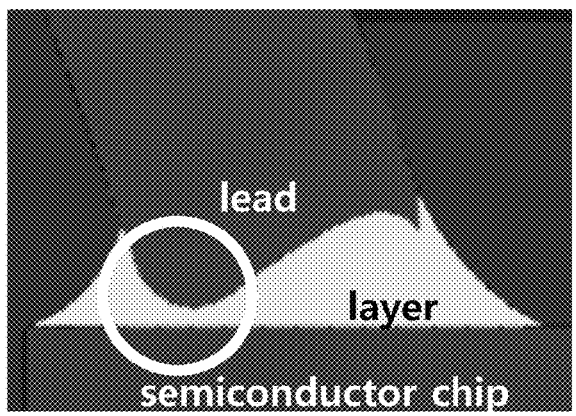
Figure 17:
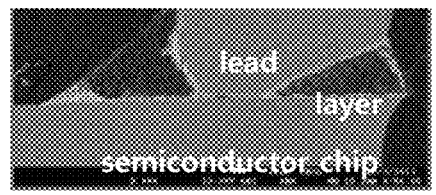

Here, the one surface S10 of the second lead member 522 faces and meets the cut surface S20 of the second lead member 522 to have a regular angle and to form a V shape, however, the present invention is not limited thereto. As illustrated in FIG. 17, a part where the one surface S10 meets the cut surface S20 may have a r value (도면에 없음) and thus, a part contacting the chip pad 511 may have a round shape. Even if the part has a round shape, the chip pad 511 contacts a part projected most and thus, line-contact may be accomplished.

As such, if the one surface S10 of the second lead member 522 or the cut surface S20 of the second lead member 522 is formed to incline at a regular angle with respect to the upper surface of the chip pad 511, the one end Q10 of the second lead member 522 is partially embedded in the adhesive layer 530 interposed between the second lead member 522 and the chip pad 511. Accordingly, even if the area of the chip pad 511 decreases, an inclined surface and the adhesive layer 530 formed on the one end Q10 of the second lead member 522 may be sufficiently secure a contact surface and thereby, an adhesive force may increase.

The adhesive layer 530 is formed of a conductive metal and may be connected to the second lead member 522 by using soldering, wherein the conductive metal may include, for example, at least one of Sn, Pb, Ag, Cu, and Au.

Figure 16:
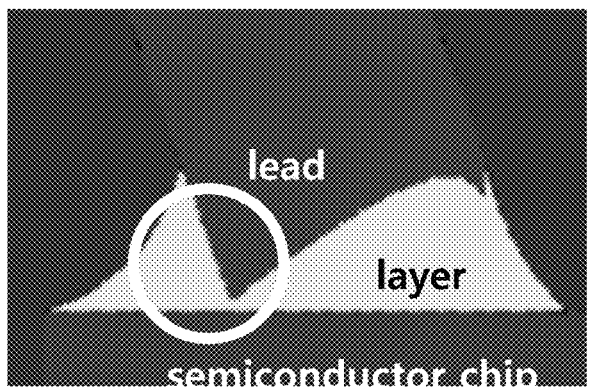
FIGS. 16 and 17 are respectively a picture illustrating one end of a lead adhered to an adhesive layer and its simulation view according to another embodiment of the present invention.
Figure 16:

FIGS. 16 and 17 are respectively a picture illustrating one end of a lead adhered to an adhesive layer and its simulation view according to another embodiment of the present invention.

Referring to FIGS. 16 and 17, the lead 700 inclines with respect to the upper surface of the chip pad 511 and the adhesive layer 530 contact the one surface S10 and the cut surface S2 of the lead 700. Accordingly, a contact area may be sufficiently secured and thereby, the lead 700 may be stably fixed to the chip pad 511.

Figure 18:
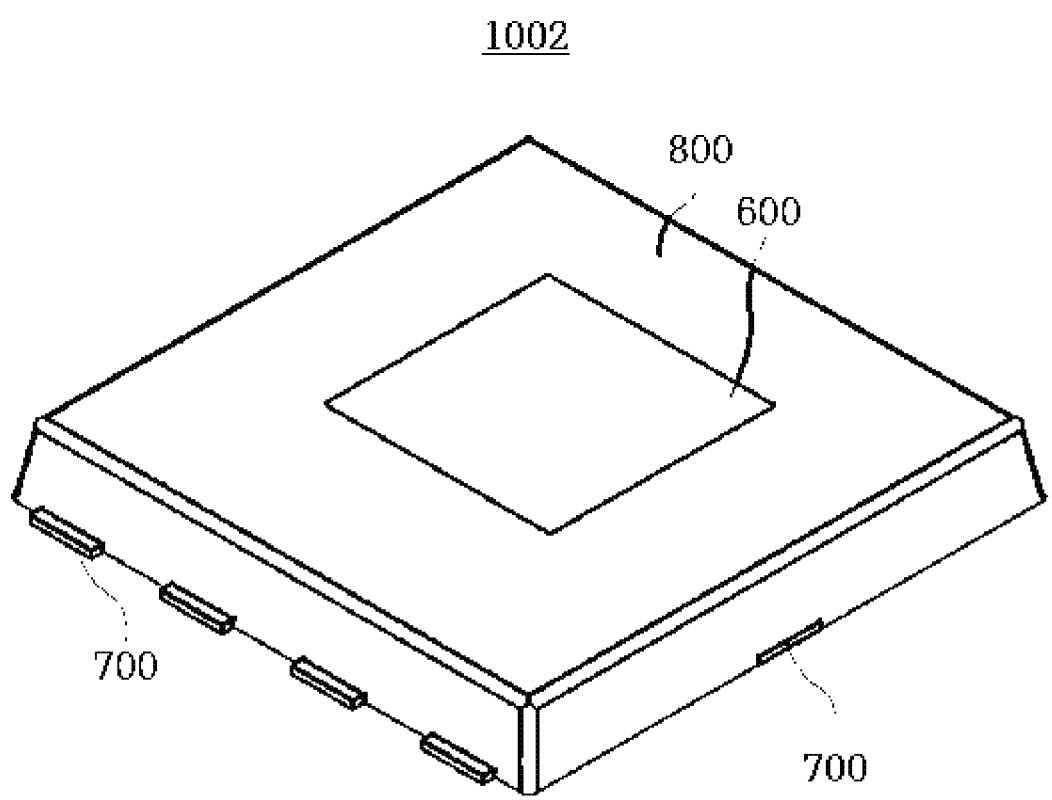
FIG. 18 is a perspective view schematically illustrating a semiconductor package according to another embodiment of the present invention.
Figure 19:
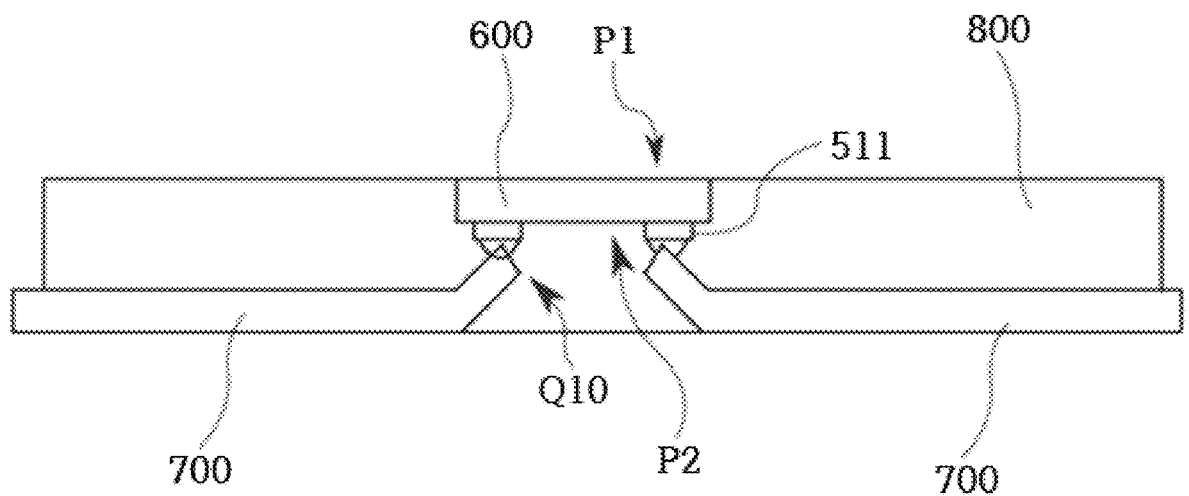
FIGS. 19 and 20 are cross-sectional views of the semiconductor package of FIG. 18.
Figure 20:
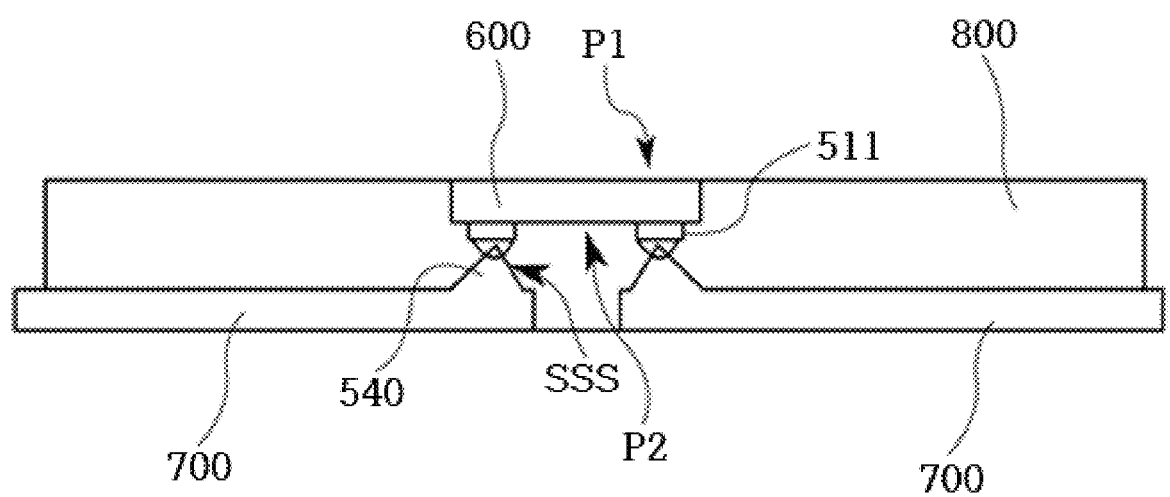

FIG. 18 is a perspective view schematically illustrating a semiconductor package 1002 according to another embodiment of the present invention and FIGS. 19 and 20 are cross-sectional views of the semiconductor package 1002.

The semiconductor package 1002 illustrated in FIGS. 18 through 20 is mostly similar to the semiconductor package 1001 illustrated in FIG. 13 and thus, only differences therebetween will be described in more detail.

The semiconductor package 1002 of FIGS. 18 through 20 includes the semiconductor chip 600 and one or more leads 700 electrically connected to the semiconductor chip 600.

Referring to FIGS. 19 and 20, the semiconductor chip 600 may be placed in the opposite direction to the semiconductor chip 600 of FIG. 13. That is, the one surface P1 of the semiconductor chip 600 is placed on the upper surface of the semiconductor package 1002 so that the one surface P1 of the semiconductor chip 600 may be exposed to the outside of the sealing member 800 on the upper surface of the semiconductor package 1002 and the other surface P2 of the semiconductor chip 600 may be disposed in the semiconductor package 1002.

In FIG. 13, the one end Q10 of the second lead member 522 contacts the one surface P1 on the semiconductor chip 600 and thus, a part of the semiconductor chip 600 is exposed to a lower surface of the semiconductor package 1001, that is the bottom surface. However, in FIGS. 18 through 20, the semiconductor chip 600 contacts the one surface P1 on the second lead member 522 and thus, a part of the semiconductor chip 600 is exposed to an upper surface of the semiconductor package 1002.

Since the semiconductor chip 600 is placed on the second lead member 522, the first lead member 521 may only include a flat part without a bending part.

Referring to FIG. 19, in order for the one end of the second lead member 522 to contact the one surface of the chip pad 511 of the semiconductor chip 600, that is, the lower surface of the chip pad 511, the edge of the second lead member 522 may be bent toward the chip pad 511. Here, the edge formed after the one surface S10 of the second lead member 522 meets the cut surface S20 of the second lead member 522 may contact the chip pad 511 of the semiconductor chip 600. Accordingly, the one surface S10 of the second lead member 522 or the cut surface S20 of the second lead member 522 may have an inclined surface inclined with respect to the one surface of the chip pad 511. An angle between the inclined surface and the chip pad 511 may be in the range of 10 to 85 degrees.

Also, as illustrated in FIG. 20, the second lead member 522 may be connected to the chip pad 511 through a projection 540 formed on the edge thereof without being bent or curved.

The projection 540 may include an inclined surface SSS inclined with respect to the one surface of the chip pad 511 of the semiconductor chip 600 and a cross-section of the projection 540 may be a triangle.

In the above embodiment, the one surface P1 of the semiconductor chip 600 is exposed to the outside of the sealing member 800. However, according to a circuit pattern, the one surface P1 of the semiconductor chip 600 is not exposed to the outside of the sealing member 800 and instead, the one surface P1 and the other surface P2 may be simultaneously filled in the sealing member 800 (not illustrated).

A number of the lead adhered to the semiconductor chip according to the embodiment of the present invention is one or more and more preferably, plural. In order to easily adhere a plurality of leads to the semiconductor chip, the leads may be connected to each other.

In this regard, the present invention will be described in more detail with reference to FIGS. 21 and 22.

Figure 21:
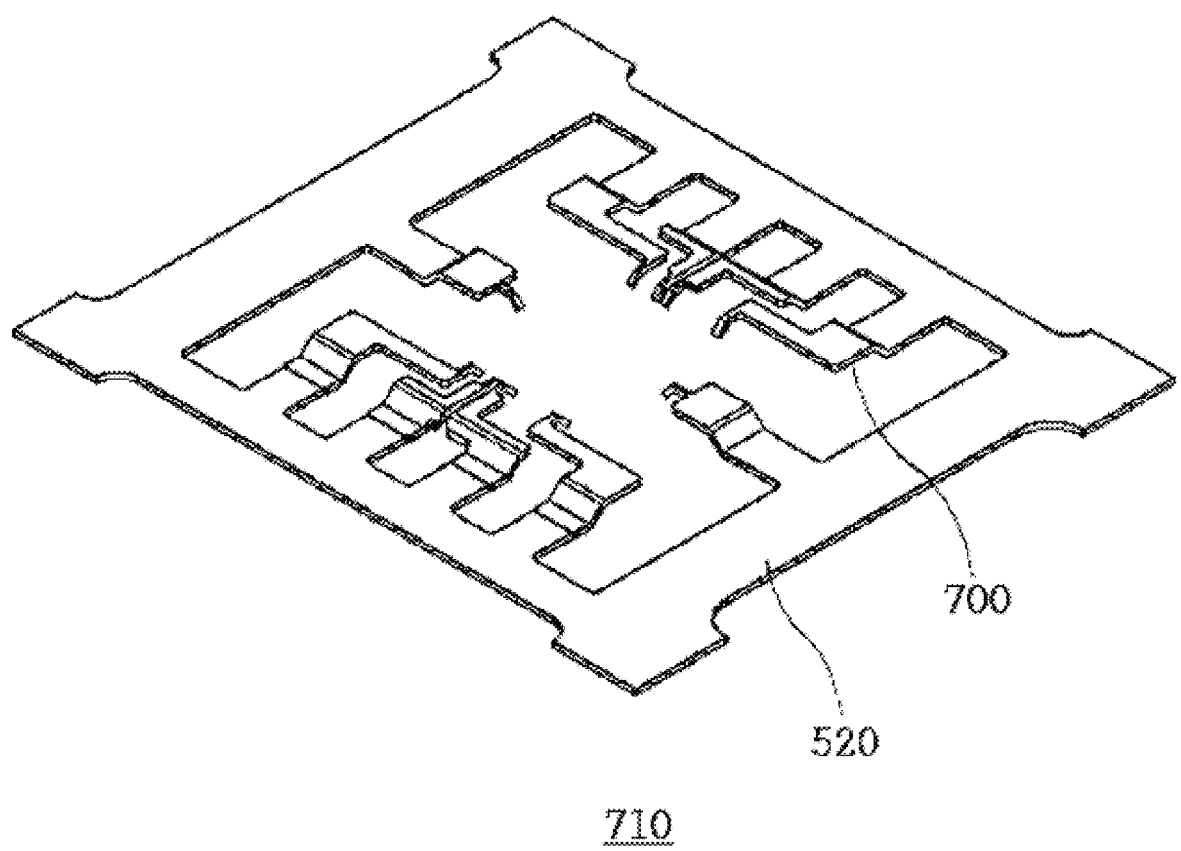
FIGS. 21 and 22 illustrate a method of manufacturing a semiconductor package according to another embodiment of the present invention.
Figure 22:
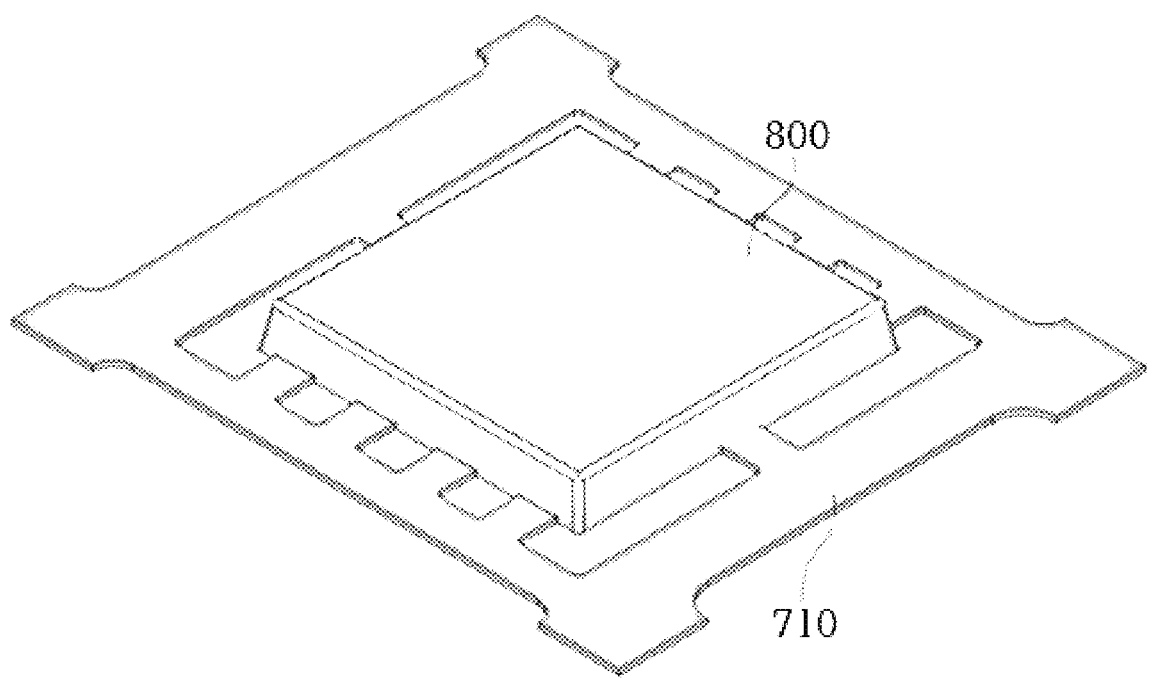

FIGS. 21 and 22 illustrate a method of manufacturing a semiconductor package according to another embodiment of the present invention.

As illustrated in FIG. 21, the semiconductor chip 600 including a GaN semiconductor and a lead member 710 including the plurality of leads 700 are prepared and the second lead member 522 is adhered on the chip pad of the semiconductor chip 600 through an adhesive layer.

The lead member 710 includes the plurality of leads 700 and a connection part 520 connecting the plurality of leads 700. The connection part 520 is used to connect the plurality of leads 700 as one so that the plurality of leads 700 may be arranged on and adhered to the semiconductor chip 600.

The connection part 520 is cut and removed after the sealing member 800 is formed and thus, the ends of the first lead members 521 may be connected.

Then, as illustrated in FIG. 22, the sealing member 800 is formed to surround the semiconductor chip 600. The sealing member 800 is formed by using a well-known technology and thereby, detailed description of forming the sealing member 800 is omitted. Here, the connection part 520 of the lead member 710 is exposed to the outside of the sealing member 800.

Then, a trimming process is performed to remove the connection part 520 exposed to the outside of the sealing member 800 as in FIG. 13, and to complete forming of the semiconductor package.

In the semiconductor package according to an embodiment of the present invention, a clip may be easily adhered to a pad area, even if a size of the pad area becomes smaller, and a sufficient adhesive force between the clip and the pad area may maintain.

Also, since a clip is used, instead of a general wire bonding, an electrical signal property and a thermal property may be improved.

In particular, when the semiconductor package according to an embodiment of the present invention is applied to a semiconductor package including a GaN material used in communication, a size of a pad area may be minimized and thereby, a communication property may be improved.

Also, in the semiconductor package according to another embodiment of the present invention, a lead may be easily adhered to a chip pad, even if a size of the chip pad becomes smaller, and a sufficient adhesive force between the lead and the chip pad may maintain.

In addition, since a lead having a width wider than a wire is used, instead of a general wire bonding, an electrical signal property and a thermal property may be improved.

In particular, when the semiconductor package according to another embodiment of the present invention is applied to a semiconductor package including a GaN material used in communication, a size of a chip pad may be minimized and thereby, a communication property may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a lead frame comprising a pad and a lead spaced apart from the pad by a regular interval;
   a semiconductor chip adhered on the pad; and
   a clip structure electrically connecting the semiconductor chip and the lead,
   wherein the clip structure comprises:
      a first flat inclined part having a first end adhered to an upper surface of a chip pad provided on the semiconductor chip, the first flat inclined part being inclined with respect to the upper surface of the chip pad;
      a first flat horizontal part extended from the first flat inclined part, the first flat horizontal part being parallel to the upper surface of the chip pad;
      a second flat inclined part extended from the first flat horizontal part, the second flat inclined part being inclined with respect to an upper surface of the lead; and
      a second flat horizontal part extended from the second flat inclined part and adhered to the upper surface of the lead, the second flat horizontal part being parallel to the upper surface of the lead,
   wherein the first end of the first flat inclined part has an upper surface, a cut surface, and a lower surface,
   wherein an edge formed by the lower and cut surfaces of the first end is embedded in a third adhesive layer provided on the upper surface of the chip pad.

2. The semiconductor package of claim 1, wherein the lead comprises a first lead and a second lead, both of which are placed at an opposite side centering around the pad, the first lead is electrically connected to a gate of the semiconductor chip, and the second lead is electrically connected to a drain of the semiconductor chip.

3. The semiconductor package of claim 1, wherein a first angle between the lower surface of the first end and the upper surface of the chip pad and a second angle between the cut surface of the first end and the upper surface of the chip pad are in the range of 10 to 85 degrees.

4. The semiconductor package of claim 1, wherein the lower surface and the cut surface of the first end incline at a regular angle in the edge and a cross-section of the edge cut along a longitudinal direction of the edge is in a V shape or a U shape.

5. The semiconductor package of claim 1, wherein the lead has a concaved part in which a first adhesive layer is filled and a lower surface of an end of the second horizontal part is adhered to the first adhesive layer.

6. The semiconductor package of claim 1, wherein the edge of the first end is in contact with the third adhesive layer along with the lower surface and the cut surface.

7. The semiconductor package of claim 1, wherein the semiconductor chip comprises a GaN semiconductor.

8. The semiconductor package of claim 1, wherein the lower surface and the cut surface of the first end incline at a regular angle in the edge and a cross-section of the edge cut along a longitudinal direction of the edge is formed to be a chamfer and contacts the upper surface of the chip pad of the semiconductor chip.

9. The semiconductor package of claim 8, wherein the edge is filled in the third adhesive layer and thus, the lower surface, the cut surface, and at least a part of the cross-section of the edge cut along a longitudinal direction of the edge simultaneously contact the third adhesive layer.

10. The semiconductor package of claim 1, wherein the pad comprises at least one or more first penetration holes and the lead comprises at least one or more of second penetration holes.

11. The semiconductor package of claim 10, wherein the lead comprises at least one or more second concaved parts interposed between the pad and the second penetration holes.

12. The semiconductor package of claim 1, wherein the third adhesive layer comprises at least one of Sn, Pb, Ag, Cu, and Au.

13. The semiconductor package of claim 12, wherein the third adhesive layer connects the first end of the first inclined part structure to the chip pad by using a soldering.

14. The semiconductor package of claim 1, wherein the lower surface and the cut surface of the first end incline at a regular angle in the edge and at least a part of a cross-section of the edge cut along a longitudinal direction of the edge contacts the upper surface of the chip pad of the semiconductor chip.

15. The semiconductor package of claim 14, wherein the edge is filled in the third adhesive layer and thus, the lower surface, the cut surface, and at least a part of the cross-section of the edge cut along a longitudinal direction of the edge simultaneously contact the third adhesive layer.

16. The semiconductor package of claim 14, wherein the cross-section formed by cutting the edge is formed to contact the upper surface of the chip pad of the semiconductor chip in a width direction with the rate of 0.3 to 0.5:1.

17. The semiconductor package of claim 16, wherein the edge is filled in the third adhesive layer and thus, the lower surface, the cut surface, and at least a part of the cross-section of the edge cut along a longitudinal direction of the edge simultaneously contact the third adhesive layer.

18. A semiconductor package comprising:
a semiconductor chip comprising at least one chip pad;
at least one lead electrically connected to the chip pad; and
a sealing member covering the semiconductor chip,
wherein each lead comprises:
a first flat inclined part having a first end adhered to an upper surface of a corresponding chip pad, the first flat inclined part being inclined with respect to the upper surface of the chip pad;
a first flat horizontal part extended from the first flat inclined part, the first flat horizontal part being parallel to the upper surface of the chip pad;
a second flat inclined part extended from the first flat horizontal part, the second flat inclined part being inclined with respect to a lower surface of the semiconductor chip; and
a second flat horizontal part extended from the second flat inclined part, the second flat horizontal part being parallel to the lower surface of the semiconductor chip,
wherein a portion of the second flat horizontal part is exposed to the outside of the sealing member,
wherein the first end of the first flat inclined part has an upper surface, a cut surface, and a lower surface,
wherein an edge formed by the lower and cut surfaces of the first end is embedded in a third adhesive layer provided on the surface of the chip pad.

* * * * *